United States Patent
Schulz

(10) Patent No.: US 7,432,709 B2
(45) Date of Patent: Oct. 7, 2008

(54) PLANAR RF RESONATOR FOR OPEN MRI SYSTEMS

(75) Inventor: Volkmar Schulz, Luebeck (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 35 days.

(21) Appl. No.: 10/597,125

(22) PCT Filed: Jan. 6, 2005

(86) PCT No.: PCT/IB2005/050071

§ 371 (c)(1), (2), (4) Date: Jul. 12, 2006

(87) PCT Pub. No.: WO2005/071428

PCT Pub. Date: Aug. 4, 2005

(65) Prior Publication Data

US 2007/0170919 A1  Jul. 26, 2007

Related U.S. Application Data

(60) Provisional application No. 60/536,758, filed on Jan. 15, 2004.

(51) Int. Cl.
*G01V 3/00* (2006.01)
(52) U.S. Cl. .......................... 324/318; 324/309
(58) Field of Classification Search .......... 324/300–322; 600/407–455; 335/216, 296; 355/216
See application file for complete search history.

(56) References Cited

U.S. PATENT DOCUMENTS

| 5,128,615 | A | 7/1992 | Oppelt et al. |
| 5,467,017 | A | 11/1995 | Duerr et al. |
| 6,441,615 | B1 * | 8/2002 | Fujita et al. ................. 324/318 |
| 6,799,366 | B2 * | 10/2004 | Tsuda ......................... 29/607 |
| 6,870,453 | B2 * | 3/2005 | Schulz et al. ............... 355/216 |
| 6,889,070 | B2 * | 5/2005 | Tsuda ......................... 600/410 |
| 2002/0087064 | A1 | 7/2002 | Tsuda |
| 2003/0016109 | A1 | 1/2003 | Schulz et al. |

FOREIGN PATENT DOCUMENTS

JP    7303621 A    11/1995

\* cited by examiner

*Primary Examiner*—Brij B Shrivastav

(57) ABSTRACT

An MRI apparatus that includes an open magnet system with pole pieces (14, 16) for generating a steady $B_0$ magnetic field in an examination zone (13). Gradient coil systems (18, 20) are disposed above and below the examination zone (13) and adjacent the pole pieces. First and second resonators (22, 24) are disposed between the gradient coil systems (18, 20) and the examination zone (13). RF screens (26, 28) are disposed between the gradient coil systems (18, 20) and the planar resonators (22, 24). The planar resonators each include a central conductor (30), such as a circular plate and an annular ring (32) surrounding and co-planar with the central conductor. Radial rungs (33) connect and are co-planar with the central conductor and annular ring. Capacitors (34), preferably numbering in the thousands, interrupt the rungs.

19 Claims, 2 Drawing Sheets

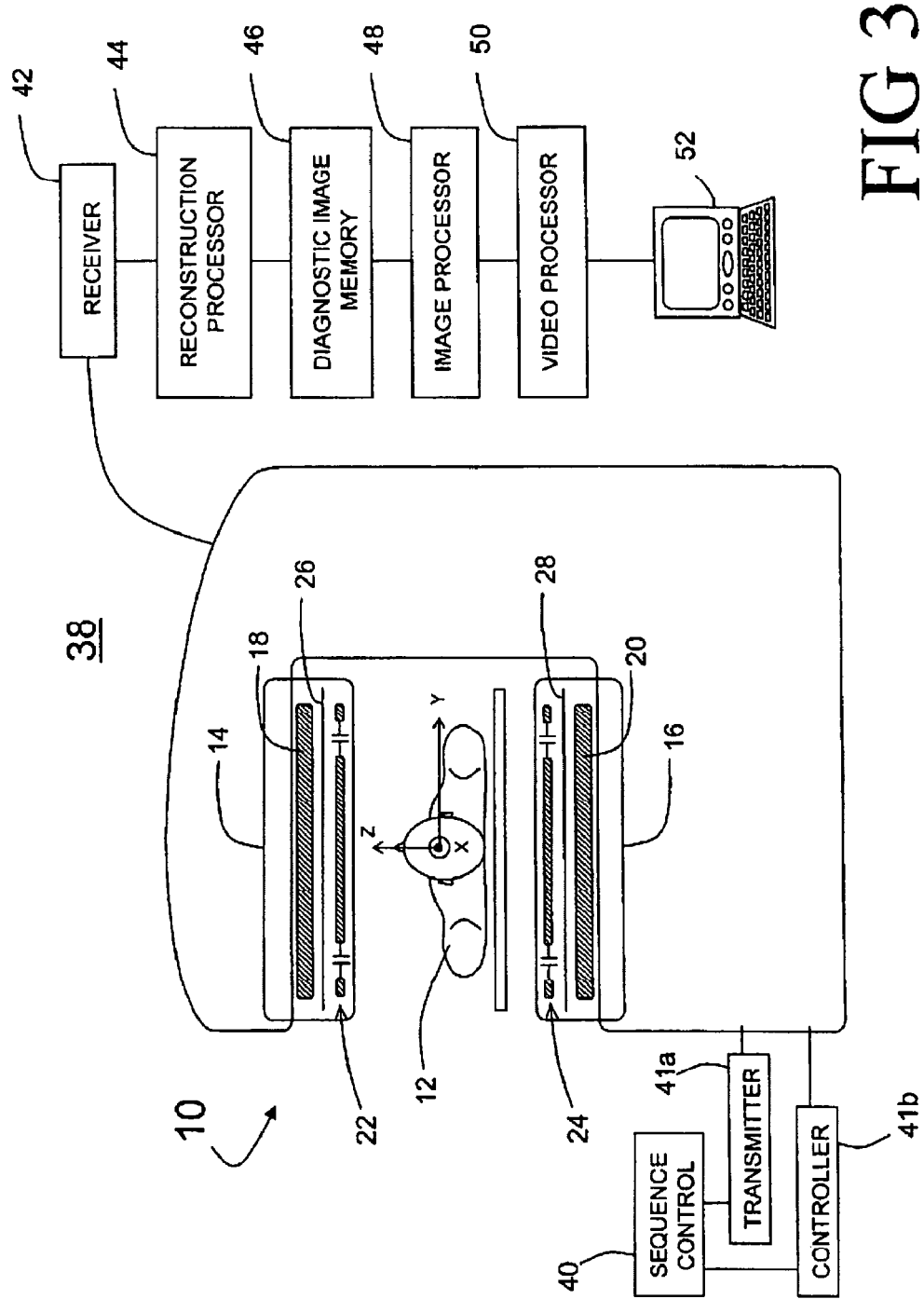

PLANAR RF RESONATOR FOR OPEN MRI SYSTEMS

CROSS REFERENCE TO RELATED APPLICATIONS

This application claims the benefit of U.S. provisional application Ser. No. 60/536,758 filed Jan. 15, 2004, which is incorporated herein by reference.

DESCRIPTION

The following relates to the diagnostic imaging arts. If finds particular application in a magnetic resonance apparatus that is provided with an open magnet system for generating a $B_0$ magnetic field in an examination zone. An open magnet system is typically a magnetic system that generates a vertical $B_0$ magnetic field between two pole plates of a permanent magnet or between two coil packages of an electromagnet. The examination zone is then open to a high degree, as opposed to a situation in the case of a closed magnet system that encloses the examination zone as a cylindrical bore.

In a magnetic resonance imaging apparatus that is used for medical diagnostics of the human body, the body axis is usually oriented horizontally, which in an open system is denoted as along the x-axis of a rectangular coordinate system. The body region to be examined is situated between the pole pieces of a magnet which generates a $B_0$ magnetic field extending in the direction of the z-axis. A resonator is provide for transmitting $B_1$ excitation signals and receiving the resonance signals.

In magnetic resonance imaging, the examination subject is positioned in a uniform magnetic field, referred to as the $B_0$ field, which aligns the nuclear spins in the body. Gradient coils generate spatially varying gradient magnetic fields across the $B_0$ field. A radio frequency (RF) antenna and RF transmitter excite the nuclear spins. The same or a different antenna receives the resonance RF signal induced by the excited nuclear spins which are forwarded to a receiver. An antenna is connected to a transmitter and the receiver via a network which serves the purpose of frequency tuning and load managing and balancing. Transmit only and receive only coils are also known in the art.

In some current open style magnetic resonance image (MRI) scanners, the RF coil is a circular plate positioned close to the patient with an annular ring disposed between the circular plate and the adjacent pole piece of the main magnet. The periphery of the plate and the annular ring are connected with a series of vertical rungs which carry capacitors analogous to a very short birdcage coil tipped vertically. The RF screen is disposed between the annular ring and the gradient coils. The circular plate carries a homogeneous current which produces a homogeneous $B_1$ field. However, the present inventor has noted that the ring produces an inhomogeneous field which contributes to the radio frequency field being emitted radially. With the current coil design, the specific absorption rate (SAR) around the bore is considered to be too high for a physician or attendant to walk around the patient during imaging.

Open MRI systems are receiving increased customer attention. Because such systems unfortunately tend to have large stray RF transmit fields, and because the SAR limits for the operator are easily reached, it is desirable to find a technique by which the stray fields can be reduced without reducing the sensitivity for signal reception. Other designs have tried to compensate for the stray field by using a butterfly-like coil which, unfortunately, leads to high local patient SAR values.

In another design, a conductive plate is placed above a conductive RF screen, the conductive plate being connected to the screen via vertically directed conductors or capacitors. However, with this design, the electromagnetic energy is radiated horizontally away from the structure and the structure is working like a dipole antenna. The present invention contemplates an improved method and apparatus that overcomes the aforementioned limitations and others.

It is an object of the present invention to provide a transmit/receive body coil for a vertical open MRI system that reduces radio frequency emissions outside of the imaging field of view.

According to one aspect, an MRI apparatus is provided that includes a magnet system for generating a $B_0$ magnetic field in an examination zone between poles. The MRI apparatus includes a first, planar resonator disposed between one of the pole pieces and the examination zone in the first resonator, arranged substantially in a first common plane. A first RF screen is disposed between the first pole piece and the first resonator.

According to another aspect, a resonator for an open MRI system includes a round, central conductor and an annular ring surrounding, and in the same plane, as the central conductor. Rungs are arranged radially between the central conductor and the annular ring, also in the same plane as the central conductor and the annular ring, with capacitors disposed in the rungs.

According to yet another aspect, a method of reducing a stray field is provided for an open MRI apparatus with a resonator adjacent a pole, and an RF screen between the resonator and the pole. The method includes mounting a planar central conductor of the resonator adjacent and displaced from the RF screen. An annular ring is mounted, surrounding the central conductor, and the central conductor is connected to the annular ring with a plurality of capacitors arranged radially.

One advantage resides in a reduced magnitude of the stray fields outside of the examination zone.

Another advantage resides in the simplified planar structure of the transmit/receive body coils.

Yet another is that diagnosticians and operators of the MRI apparatus can be adjacent the subject during an imaging procedure without exceeding SAR limits.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 3 diagrammatically shows a magnetic resonance imaging system constructed according to concepts of the present invention.

Figure 1:
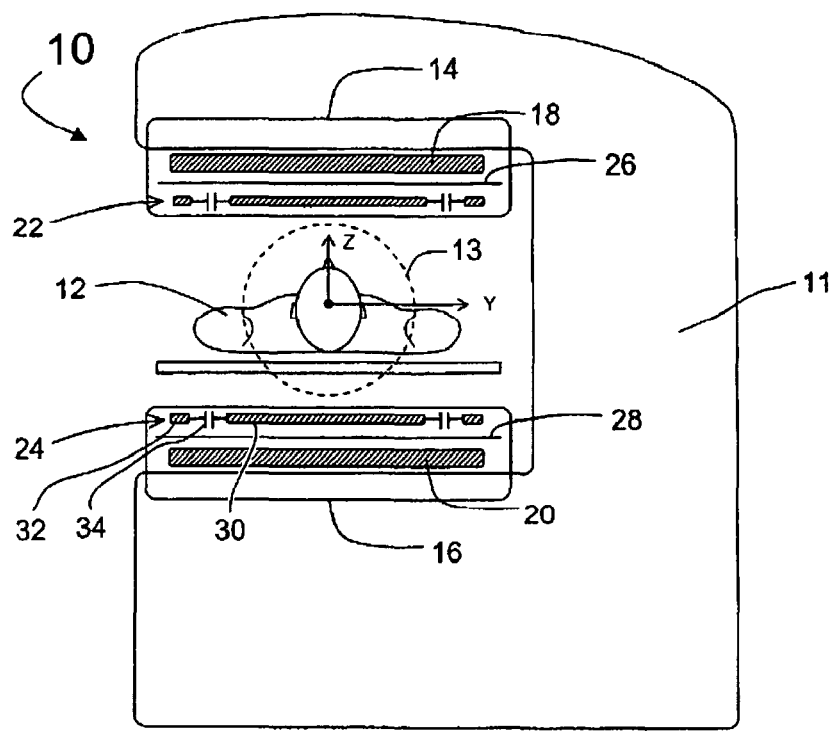
FIG. 1 is an elevational view in partial section of a magnetic resonance imaging apparatus with a resonator constructed in accordance with concepts of the present invention.

With reference to FIG. 1, a magnetic resonance imaging (MRI) apparatus 10 includes a main magnet 11 system for generating a temporally constant $B_0$ magnetic field that extends vertically in an examination zone in the z direction of an xyz coordinate system as shown. A region of interest of a patient 12 is disposed in an examination zone 13 defined by a field of view (FOV) of the apparatus—often a spherical region. The magnet system includes a ferrous yoke defining a flux return path between pole pieces 14,16. Coil windings, superconducting or resistive, are disposed adjacent the pole pieces 14,16 or along the flux return path. Alternately, the yoke can be a permanent magnet.

Gradient coil systems 18,20 generate spatially variant magnetic field pulses with an approximately linear gradient in the x direction, the y direction or the z direction. A respective resonator 22,24 that is resonant at the Larmor frequency is disposed between each gradient coil system 18,20 and the examination zone. The resonators, in one embodiment, form part of a quadrature coil system for generating a circularly polarized RF magnetic field of Larmor frequency perpendicular to the z direction in the examination zone 13, and for receiving magnetic resonance (MR) signals from the examination zone 13. An RF shielding screen 26 is disposed above the resonator 22 and is of larger diameter than the resonator 22; a second RF screen 28 is similarly disposed below the resonator 24. The resonators 22,24 and RF shields 26,28, are arranged in a mirror-image fashion relative to the examination zone and advantageously have an identical construction. Accordingly, only resonator 24 is described in detail below, and it is understood that the description is equally applicable to resonator coil 22.

Figure 2:
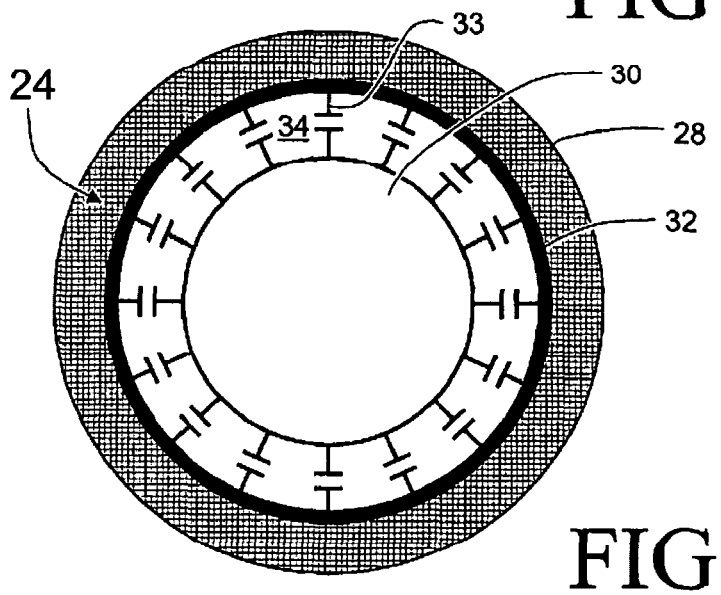
FIG. 2 is an top plan view of an RF coil or resonator constructed in accordance with concepts of the present invention.

With reference now to FIG. 2, a circular plate 30 is surrounded by an annular ring 32 which lies in the same plane as the circular plate 30. A series of rungs 33 which carry capacitors 34 extend radially connecting the central plate and the ring. Moving the annular ring 32 farther away from the RF screen 28 than in previous embodiments improves decoupling the ring from the screen and improves sensitivity. It is advantageous to maintain both the circular plate 30 and the annular ring 32 as far from the RF shield 28 as possible. The planar approach optimizes this displacement without encroaching on and reducing the size of the examination zone. Further, an optimal distance between the center plate 30 and the annular ring 32 can be found to suppress, or minimize, the stray electric field at a distance of, e.g., 1.4 meters from the center of the examination zone 13. This is accomplished without significantly shielding the field in the examination zone 13 and without increasing the dissipation (local SAR) inside the patient 12.

A second design feature includes maximally distributing the capacitors 34, such as by the use of as many capacitors 34 as possible in each rung with as many rungs as possible. This can be accomplished inexpensively, for example, by utilizing printed circuit board (PCB) technology. A large number of capacitors, preferably numbering in the several hundreds, are thus incorporated. Capacitors cause relatively large fields around themselves, which is not advantageous. By distributing the capacitance over a very large number of smaller capacitors the fields around the capacitors can be greatly reduced. For example, with this design, the stray electric field at a radius of approximately 1.4 meters from the isocenter (origin of the coordinate system as illustrated in FIG. 1) is reduced to ⅛ of what it was with a prior design. Thus, the Poynting vector of stray electromagnetic fields in the diagnostician or attendant area is greatly reduced by a factor of 64.

In this novel embodiment of a fully planar design of the transmit/receive body coil 36 for a vertical open system, the use of an outer conductive ring 32 carrying a return current actively shields the transmit/receive body coil 36. Thus, the magnetic flux (electric field) is returned (localized) in an upper plane due to the use of the annular ring 32 around the conductive plate 30. This acts like an active magnetic and electric shield. A further advantage of this design derives from the large number of capacitors 34 which store maximum energy at the resonance frequency. The local patient SAR is thereby reduced because of the large number of capacitors 34. Large gradient currents can be avoided by the use of a slit pattern as described in a co-pending application, Publication Number US 2003/0016109 A1. As another option, the circular plate 30 can be replaced by an annular ring. Further, although the illustrated circular geometry has symmetry advantages, the center plate or ring and the peripheral ring can have other geometries, e.g. oval.

With reference now to FIG. 3 an exemplary MRI system 38 is described, but is not described in intricate detail, since the other components of the open MRI apparatus 10 are well known in the art. The MRI apparatus 10 includes a pair of the resonators 22,24 arranged in a mirror-like fashion as previously described. Each resonator 22,24 preferably functions as a transmit/receive body.

A sequence control processor 40 controls a radio frequency transmitter 41*a* associated with the transmit/receive body coils 22,24 and a gradient field controller 41*b* to induce and manipulate spatially encoded resonance as known in the art. The generated magnetic resonance signals are picked up by the RF transmit/receive body coils 22,24, demodulated by a receiver 42 and reconstructed by an MRI image reconstruction processor 44 into an electronic image representation. The electronic image representation of the region of interest of the subject 12 is stored in an MRI volume image memory 46.

Further analysis and processing of the volumetric image data in image memory 46 may be performed by an image processor 48. Under control of an oncologist, radiologist, or other clinician, a video processor 50 selects portions of the volumetric image data as manipulated by image processor 48 and converts the image data into appropriate form and format for display on a monitor 52, such as a video monitor, a CCD display, an active matrix, plasma, or the like. The video processor 48 may select slice images, surface renderings, projection images or other diagnostic imaging formats as are known in the art.

The invention has been described with reference to a preferred embodiment. The invention has also been described with respect to several alternate embodiments. These and other variations and modifications of the invention will occur to others upon the reading and understanding of this specification. It is intended that all such variations, alterations and modifications, be included insofar as they come within the scope of the appended claims or the equivalents thereof.

The invention claimed is:

1. An MRI apparatus that includes a magnet system for generating a $B_0$ magnetic field in an examination zone between poles, the apparatus comprising:

a first, planar resonator disposed between one of the pole pieces and the examination zone, arranged substantially in a first common plane, the first resonator including a first conductor in the first common plane, a first conducting ring in the first common plane surrounding the first conductor, and a first plurality of capacitors arranged radially around the first conductor and connecting the first conductor to the first conducting ring; and a first RF screen disposed between the first pole piece and the first resonator.

2. The MRI apparatus as set forth in claim 1, further including:

a first gradient coil system disposed between the first RF screen and the first pole piece.

3. The MRI apparatus as set forth in claim 1, further including:

a second, planar resonator disposed between the remaining one of the pole pieces and the examination zone, arranged substantially in a second common plane;

a second RF screen disposed between the second pole piece and the second resonator; and a second gradient coil system disposed between the second RF screen and the remaining pole piece.

4. The MRI apparatus as set forth in claim 2, wherein the first conductor of the first, planar resonator includes a first circular plate and the first conducting ring includes a first circular conducting ring surrounding the first circular plate.

5. The MRI apparatus as set forth in claim 4, further comprising:

a second, planar resonator disposed between the remaining one of the pole pieces and the examination zone, arranged substantially in a second common plane, the second, planar resonator including a second circular plate in the second common plane, a second circular conducting ring in the second common plane surrounding the second circular plate, and a second plurality of capacitors arranged radially around the second circular plate, connecting the second circular plate to the second circular conducting ring;

a second RF screen disposed between the second pole piece and the second, planar resonator; and a second gradient coil system disposed between the second RF screen and the remaining pole piece.

6. The MRI apparatus as set forth in claim 5, wherein each of the first and second RF screens is larger in diameter than the respective resonator.

7. The MRI apparatus as set forth in claim 5, wherein said first and second plurality of capacitors are PCB capacitors.

8. The MRI system as set forth in claim 4, further including:

sequence control means for controlling a gradient control and RF transmitter to induce spatially encoded magnetic resonance signals in the examination zone;

receiving means for receiving and demodulating magnetic resonance signals received from the first planar resonator;

reconstruction means for reconstructing the demodulated magnetic resonance signals into at least one image representation;

memory means for storing image data of the at least one image representation;

image processing means for performing image and volumetric analysis of the image data, and creating analysis data;

video processing means for converting the image data and analysis data into an appropriate format for display; and display means for displaying the converted image data and the converted analysis data.

9. The MRI apparatus as set forth in claim 1, wherein the first conductor of the first, planar resonator includes a first ring or plate in the first common plane and the first conducting ring includes a first conducting ring in the first common plane and surrounding the first ring or plate.

10. The MRI apparatus as set forth in claim 2, wherein the $B_0$ magnetic field is a vertical field.

11. A planar resonator for use in the MRI apparatus of claim 1.

12. A resonator for an open MRI system, the resonator comprising:

a round, central conductor;

an annular ring surrounding and in the same plane as the central conductor;

a plurality of rungs arranged radially between the central conductor and the annular ring and in the same plane as the central conductor and the annular ring; and a plurality of capacitors disposed in the rungs.

13. The resonator as set forth in claim 12, wherein the central conductor is a plate.

14. The resonator as set forth in claim 12, wherein the central conductor is circular.

15. The resonator as set forth in claim 12, wherein the plurality of capacitors includes at least 1000 capacitors.

16. A method of reducing a stray field in an open MRI apparatus with a resonator adjacent a pole and an RF screen between the resonator and the pole, the method comprising:

mounting a planar central conductor of the resonator adjacent and displaced from the RF screen;

mounting an annular ring coplanar with the planar central conductor and surrounding the central conductor;

connecting the central conductor to the annular ring with a plurality of capacitors arranged radially.

17. The method as set forth in claim 16, wherein the planar central conductor is a plate.

18. The method as set forth in claim 16, wherein the plurality of capacitors is a maximal number of capacitors.

19. The method as set forth in claim 16, wherein the distance between the RF screen and the resonator is maximized.

\* \* \* \* \*